United States Patent [19]

Imanishi

[11] Patent Number: 5,081,426

[45] Date of Patent: Jan. 14, 1992

[54] POWER AMPLIFIER HAVING A STANDBY CIRCUIT

[75] Inventor: Kazuo Imanishi, Yokohama, Japan

[73] Assignee: Kabushiki Kaisha Toshiba, Kanagawa, Japan

[21] Appl. No.: 619,976

[22] Filed: Nov. 30, 1990

[30] Foreign Application Priority Data

Nov. 30, 1989 [JP] Japan .................................. 1-311354

[51] Int. Cl.⁵ ............................................... H03F 3/26
[52] U.S. Cl. ..................................... 330/296; 330/267; 330/273; 330/297
[58] Field of Search ................. 330/146, 51, 202, 203, 330/267, 273, 296, 297

[56] References Cited

U.S. PATENT DOCUMENTS 4,853,648 8/1989 Imanishi ............................ 330/273

Primary Examiner—James B. Mullins
Attorney, Agent, or Firm—Banner, Birch, McKie & Beckett

[57] ABSTRACT

A power amplifier having a standby switch according to the present invention comprises an amplifier circuit, a bias circuit serving as a bias source of the amplifier circuit a detector circuit for detecting a variation in a power source voltage to turn on or off the standby switch, a standby circuit for extinguishing a waveform of an output voltage of the amplifier circuit the moment that the standby switch is turned off, and a delay circuit for cutting off the bias source of the amplifier circuit after a lapse of a predetermined time period after the standby switch is turned off.

10 Claims, 3 Drawing Sheets

POWER AMPLIFIER HAVING A STANDBY CIRCUIT

BACKGROUND OF THE INVENTION

1. Field of the Invention

The present invention relates to an integrated-circuit power amplifier of a bridge transformer less (BTL) type having a standby switch which is particularly used in audio systems.

2. Description of the Related Art

Recently, most of integrated-circuit power amplifiers used in audio systems have a BTL structure as shown in FIG. 1 in order to achieve high power. In the BTL structure, output voltages $V_1$ and $V_2$ of amplifier circuits 101 and 102 have phases opposite to each other and the same amplitude. Voltage V applied to load 103 such as a speaker is thus expressed as follows.

$$V = V_1 - V_2 = V_1 - (-V_1) = 2V_1$$

where $V_1 = -V_2$. The amplitude in the voltage applied to load 103 is about twice as large as the ordinary amplitude. When the amplitudes of output voltages $V_1$ and $V_2$ of amplifier circuits 101 and 102 are increased in the same phase, no output waveform appears, accordingly no voltage is applied to load 103.

The BTL type power amplifier usually includes a standby switch for not directly turning on or off a power source but turning on or off an internal transistor circuit and cutting off a circuit such as a bias source to equivalently turn on or off amplifier circuits 101 and 102. Any large-capacity relay or switch is not therefore required, and amplifier circuits 101 and 102 can be turned on or off by a small-power switch or a signal supplied from a microcomputer.

Further, in the BTL type power amplifier, it is necessary to eliminate noise (i.e., pop) caused in the transition from the on-state to the standby state (in which the power source is on but the bias source is off and the amplifier circuits are equivalently in the offstate) of amplifier circuits 101 and 102 and to avoid a noise-remaining phenomenon in which the noise remains for a short period of time after the on-state has been changed to the standby state by the time constant of an external capacity. In the transition, therefore, the bias source is not turned off instantaneously but after the amplitudes of output voltages $V_1$ and $V_2$ of amplifier circuits 101 and 102 are quickly increased in the same phase so as to reach the power source voltage or ground voltage (or negative power source voltage) and then the output signals of the amplifier circuits are extinguished.

The BTL type power amplifier having the above structure is used as an audio mute for eliminating noise caused when a tuner is detuned. If the power amplifier malfunctions, its on-state is changed to the standby state to prevent noise from generating from speakers. It is more effective when a system such as tuner and amplifier malfunctions earlier than the power amplifier itself by a sudden change of the power source voltage as in audio systems installed in automobiles. More specifically, when a power source (Vcc) line is monitored and its voltage is dropped to such an extent that the system cannot be normally operated, a standby signal is supplied to the power amplifier. If a microcomputer includes a low-voltage detecting function, a logic signal is supplied to the power amplifier to render it in the standby state.

When the power source voltage is dropped even in the standby state, a battery line may be cut off by the main key switch of, for example, an audio system installed in an automobile. In this state a circuit for maintaining the standby state cannot be normally operated and a pop may thus be generated in the output signals of the amplifier circuits.

The detection of a decrease in the power source voltage using a power-source line monitor arranged at the power amplifier side is very difficult since a detected voltage and detection timing vary from system to system. If the bias source is instantaneously cut off in the transition from the on-state to the standby state, a pop may be generated by the influence of the external capacity.

SUMMARY OF THE INVENTION

It is accordingly an object of the present invention to provide a power amplifier in which a variation and, in particular, a decrease in a power source voltage is detected to prevent a pop from being generated in the transition from an on-state to a standby state and also prevent a noise from being generated in the standby state and when a power source voltage is lowered.

To attain the above object, a power amplifier having a standby switch according to the present invention comprises:

an amplifier circuit;

a bias circuit serving as a bias source of the amplifier circuit;

a detector circuit for detecting a variation in a power source voltage to turn on and off the standby switch;

a standby circuit for extinguishing a waveform of an output voltage of the amplifier circuit the moment that the standby switch is turned off; and a delay circuit for cutting off the bias source of the amplifier circuit after a lapse of a predetermined time period after the standby switch is turned off.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will be described with reference to the accompanying drawings.

Figure 1:
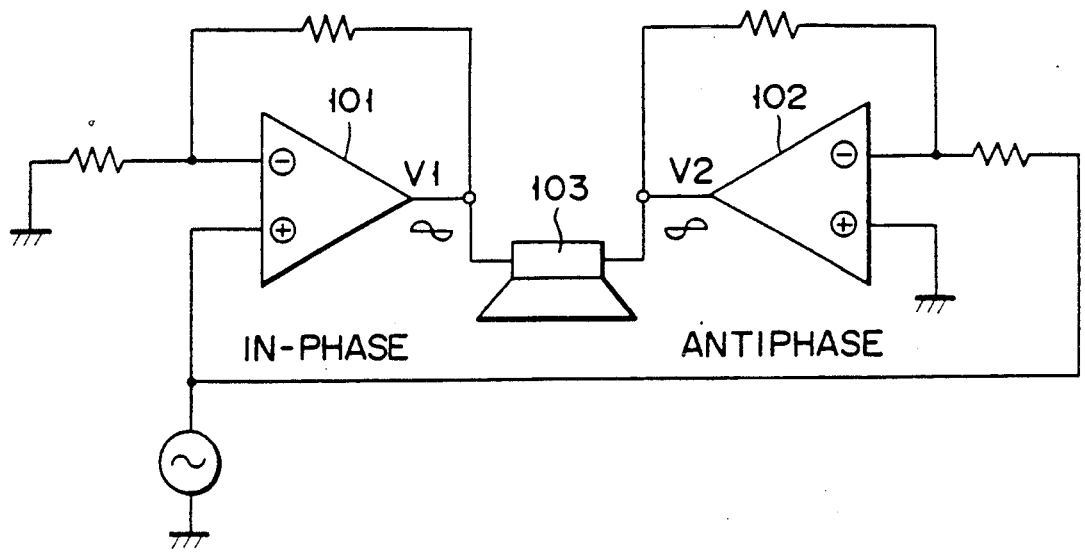
FIG. 1 is a view showing the principle of a conventional power amplifier having a BTL structure.
Figure 2:
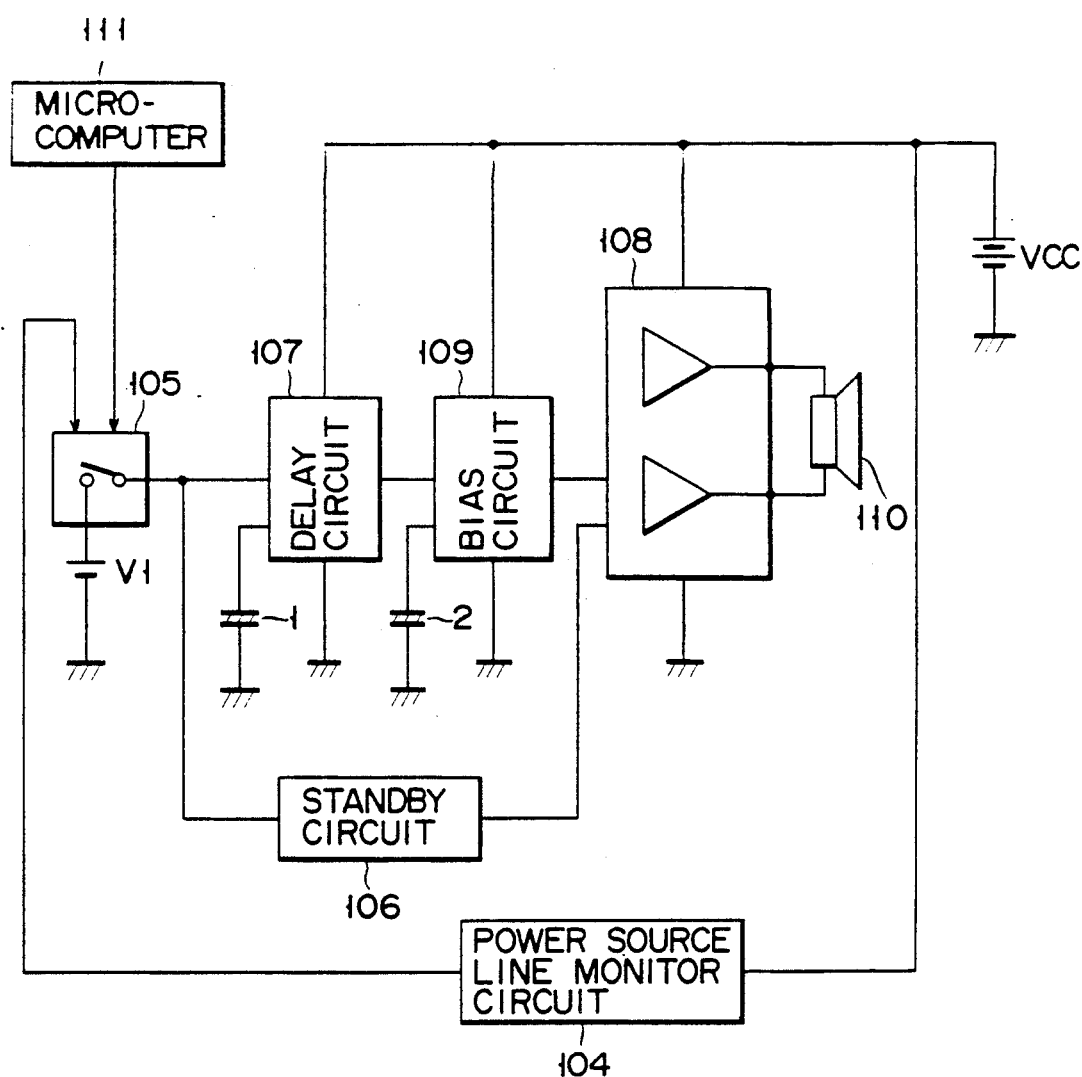
FIG. 2 is a block diagram showing the principle of a power amplifier according to an embodiment of the present invention.

FIG. 2 is a block diagram showing the principle of a power amplifier according to an embodiment of the present invention.

Power source line monitor circuit 104 is connected to a power source (Vcc) line and turns on or off standby switch 105 in accordance with variations in a power source voltage. Standby switch 105 is turned on or off by signals output from microcomputer 111. Reference voltage $V_1$ is applied to standby circuit 106 and delay circuit 107 by means of standby switch 105. Standby circuit 106 is connected to amplifier circuit 108. Delay circuit 107 is connected to bias circuit 109 serving as a bias source of amplifier circuit 108. Bias circuit 109 is connected to amplifier circuit 108 having a BTL structure. Load 110 such as a speaker is connected to an output of amplifier circuit 108.

When power source line monitor circuit 104 detects that the power source voltage has been dropped by a predetermined value, standby switch 105 is turned off, irrespective of the signals output from microcomputer 111. The instant that standby switch 105 is turned off, standby circuit 106 increases the amplitude of an output voltage of amplifier circuit 108 in the same phase so as to reach a power source voltage or a ground voltage (or negative power source voltage) to extinguish an output waveform of amplifier circuit 108. At the same time, delay circuit 107 is operated to delay the signal by predetermined time by the time constant depending upon capacitance $C_1$ of capacitor 1, and then the bias source of amplifier circuit 10 is cut off.

In the embodiment of the present invention, since delay circuit 107 is connected between standby switch 105 and bias circuit 109, no pop is generated on an output signal when the power source voltage is decreased after a transfer to the standby state. In other words, the time constant of delay circuit 107 has only to be preset so as to always cut off the bias source before standby circuit 106 for maintaining the standby state is disabled from normally operating.

Figure 3:
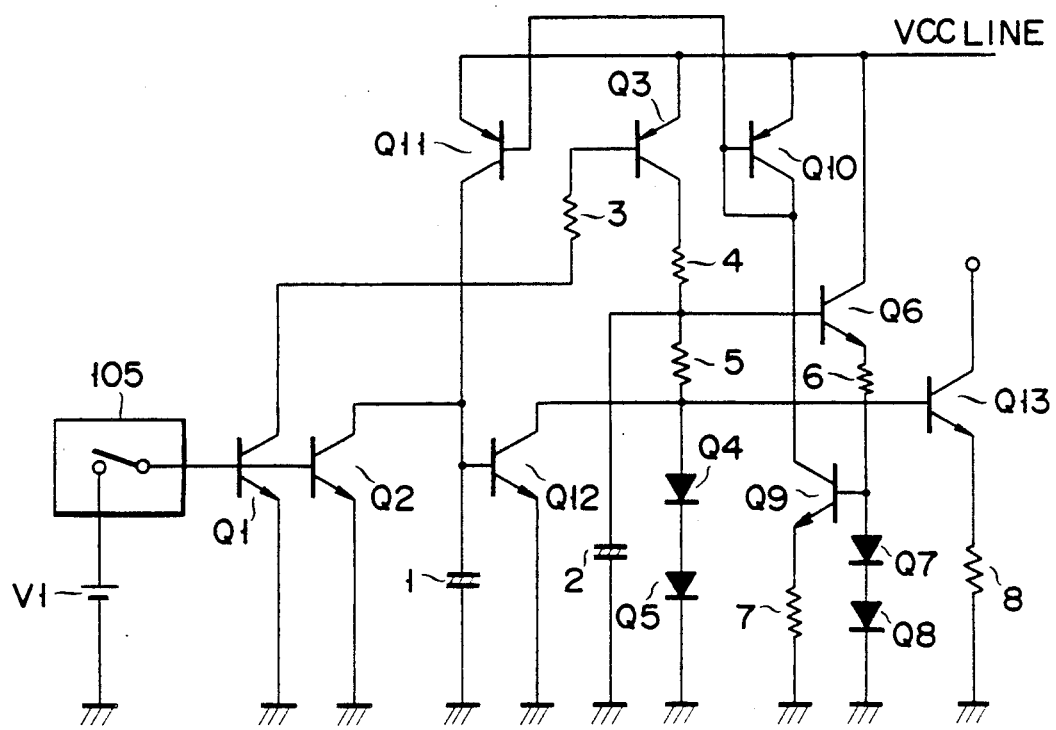
FIG. 3 is a circuit diagram specifically showing a delay circuit and a bias circuit of the power amplifier shown in FIG. 2.

FIG. 3 illustrates arrangements of delay circuit 107 and bias circuit 109 of the power amplifier shown in FIG. 2.

Reference voltage $V_1$ is applied to the bases of npn transistor $Q_1$ and $Q_2$ through standby switch 105. The emitters of transistors $Q_1$ and $Q_2$ are connected to ground (GND). The collector of transistor $Q_1$ is connected to the base of pnp transistor $Q_3$ through resistor 3. The emitter of transistor $Q_3$ is connected to a power source (Vcc) line. The collector of transistor $Q_3$ is connected to ground through resistors 4 and 5 and diode-connected transistors $Q_4$ and $Q_5$. Capacitor 2 is connected between a ground and a connecting point of resistors 4 and 5 and also connected to the base of npn transistor $Q_6$. The collector of transistor $Q_6$ is connected to the power source line. The emitter of transistor $Q_6$ is connected to ground through resistor 6 and diode-connected transistors $Q_7$ and $Q_8$. The base of npn transistor $Q_9$ is connected between resistor 6 and diode-connected transistors $Q_7$ and $Q_8$. The emitter of transistor $Q_9$ is connected to ground through resistor 7. The collector of transistor $Q_9$ is connected to the base and collector of pnp transistor $Q_{10}$. The emitter of transistor $Q_{10}$ is connected to the power source line. The base of transistor $Q_{10}$ is connected to the base of pnp transistor $Q_{11}$. The emitter of transistor $Q_{11}$ is connected to the power source line. The collector of transistor $Q_{11}$ is connected to the collector of transistor $Q_2$ and the base of npn transistor $Q_{12}$ and also connected to ground through capacitor 1. The emitter of transistor $Q_{12}$ is grounded. The collector of transistor $Q_{12}$ is connected between resistor 5 and diode-connected transistors $Q_4$ and $Q_5$ and also connected to the base of npn transistor $Q_{13}$. The emitter of transistor $Q_{13}$ is connected to ground through resistor R8.

Referring to FIGS. 2 and 3, an operation of the power amplifier will be described in detail.

When amplifier circuit 108 is in an on-state, i.e., when the amplifier circuit generates an output signal, standby switch 105 is closed and reference voltage $V_1$ is applied to transistors $Q_1$ and $Q_2$. Transistors $Q_1$ and $Q_2$ are thus rendered in an on-state and transistor $Q_3$ is turned on. Transistors $Q_4$ to $Q_{11}$ and $Q_{13}$ are turned on, accordingly. Transistor $Q_{12}$ is however cut off since transistor $Q_2$ is turned on. This is because the voltage between the base and emitter of transistor $Q_{12}$ corresponds to a saturated voltage between the collector and emitter of transistor $Q_2$ and therefore it can be regarded as $\approx 0$.

If a power source voltage is decreased below a predetermined reference value, this decrease is detected by power source line monitor circuit 104. Power source line monitor circuit 104 causes an external trigger to turn off standby switch 105 and, in this time, transistors $Q_1$ to $Q_3$ are instantaneously turned off. However, transistors $Q_4$ to $Q_{11}$ and $Q_{13}$ are kept in an on-state for a while since the charges of capacitor are maintained by the time constant of about $C_2$ (capacitance of capacitor 2) $\times R_5$ (resistance of resistor 5).

When transistor $Q_{11}$ is turned on, collector current $I_{CQ11}$ is expressed by the following equation.

$$I_{CQ11} = (V_{BEQ7} + V_{BEQ8} - V_{BEQ9})/R_7 \approx V_{BE}/R_7$$

where $R_7$ is a resistance of resistor $R_7$, $V_{BEQ7}$, $V_{BEQ8}$ and $V_{BEQ9}$ are voltages between the bases and emitters of transistors $Q_7$, $Q_8$ and $Q_9$, and $V_{BEQ7} = V_{BEQ8} = V_{BEQ9} = V_{BE}$. The collector current is thus a constant current. When transistor $Q_2$ is turned on, collector current $I_{CQ11}$ is connected to ground through transistor $Q_2$. When transistor $Q_2$ is turned off, capacitor 1 starts to be charged.

Transistor $Q_{12}$ can thus be turned on when electric charge q arrives at the time satisfying the following condition.

$$q = C_1 \cdot V_{BEQ12(ON)} = I_{CQ11} \cdot t$$

$$t = \{C_1 \cdot V_{BEQ12(ON)}\}/I_{CQ11}$$

where $C_1$ is a capacitance of capacitor 1, and $V_{BEQ12(ON)}$ is a base-to-emitter voltage for turning on transistor $Q_{12}$. Transistor $Q_{12}$ is thus turned on after a lapse of time t. If transistor $Q_{12}$ is turned on, transistor $Q_{13}$ is turned off and accordingly the bias source of the amplifier circuit is cut off.

If delay time t is set so that the bias source can be cut off before a decrease in the power source voltage prevents standby circuit 106 from normally operating, no abnormal sound occurs. The following relationship is however required.

$$t << C_2 \times R_5$$

$$\{C_1 \cdot V_{BEQ12(ON)}\}/I_{CQ11} << C_2 \times R_5$$

With the arrangement described above, the bias source cannot be cut off instantaneously but after a lapse of predetermined delay time t after the waveform of an output signal is extinguished by standby circuit 106. An output signal of amplifier circuit 108 can thus be extinguished without any remaining sound or uncomfortable pop. Furthermore, after the bias source of amplifier circuit 108 is cut off and the other bias sources are then cut off, the whole system including the power amplifier is completely turned off. Delay time t is always set shorter than the time in which standby circuit 106 is disabled from normally operating when the power source voltage is decreased after the on-state is changed to the standby state. Even if standby circuit 106 is turned off by the decrease in the power source voltage, the bias source of amplifier circuit 108 is cut off. Therefore, amplifier circuit 108 does not malfunction, nor is any abnormal sound generated from amplifier circuit 108. In other words, a system for reducing an output voltage and preventing an abnormal sound from generating when an output is cut off, can be formed in a power amplifier, an audio system or the like having a standby switch.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A power amplifier having a standby switch comprising:
    an amplifier circuit;
    a bias circuit serving as a bias source of said amplifier circuit;
    a detector circuit for detecting a variation in a power source voltage to turn on or off the standby switch;
    a standby circuit for extinguishing a waveform of an output voltage of said amplifier circuit the moment that the standby switch is turned off; and
    a delay circuit for cutting off the bias source of said amplifier circuit after a lapse of a predetermined time period after the standby switch is turned off.

2. The power amplifier according to claim 1, wherein said amplifier circuit has a BTL structure, and said standby circuit maximizes, in the same phase, an output voltage of said amplifier circuit to extinguish a waveform of a signal from said amplifier circuit.

3. The power amplifier according to claim 1, wherein said detector circuit turns off the standby switch when the power source voltage is lowered below a predetermined value.

4. The power amplifier according to claim 1, wherein said standby switch is controlled by a microcomputer in a normal operating state.

5. The power amplifier according to claim 1, wherein said predetermined time is shorter than time in which the standby circuit is not normally operated by a variation in the power source voltage.

6. A power amplifier for use in an audio system, comprising:
    a stand-by switch for switching said power amplifier between a stand-by mode and a normal operating mode;
    an amplifier circuit;
    a bias circuit for biasing said amplifier circuit;
    a detector circuit for detecting variations in a power source voltage and controlling the switching of said stand-by switch in response thereto;
    a stand-by circuit for minimizing a potential difference of an output of said amplifier circuit when said stand-by switch switches said power amplifier to the stand-by mode; and
    a delay circuit for switching off said bias source at a predetermined time after said power amplifier is switched to the stand-by mode.

7. The power amplifier according to claim 6, wherein said amplifier circuit comprises a BTL amplifier circuit having first and second output voltages.

8. The power amplifier according to claim 7, wherein said stand-by circuit minimizes an output of said BTL amplifier circuit by maximizing, in phase, the first and second output voltages.

9. The power amplifier according to claim 6, wherein said detector circuit switches said stand-by switch so as to switch said power amplifier to a stand-by node when the power source voltage falls below a predetermined value.

10. The power amplifier according to claim 6, further comprising:
    a microcomputer for controlling said stand-by switch during the normal operation mode.

* * * * *